United States Patent [19]

Hosaka

[11] Patent Number: 4,954,867
[45] Date of Patent: Sep. 4, 1990

[54] SEMICONDUCTOR DEVICE WITH SILICON OXYNITRIDE OVER REFRACTORY METAL GATE ELECTRODE IN LDD STRUCTURE

[75] Inventor: Takashi Hosaka, Tokyo, Japan
[73] Assignee: Seiko Instruments Inc., Japan
[21] Appl. No.: 201,052
[22] Filed: Jun. 1, 1988
[30] Foreign Application Priority Data Jun. 18, 1987 [JP] Japan .................. 62-152236

[51] Int. Cl.[5] ............ H01L 29/78; H01L 21/94
[52] U.S. Cl. .................... 357/52; 357/54; 357/65; 357/23.3; 357/23.5
[58] Field of Search ............ 357/52, 23.5, 23.3, 357/54, 65

[56] References Cited

U.S. PATENT DOCUMENTS

| | | | |
|---|---|---|---|
| 3,629,088 | 12/1971 | Frank | 357/54 |
| 4,581,622 | 4/1986 | Takasaki et al. | 357/52 |
| 4,663,645 | 5/1987 | Komori et al. | 357/23.5 |
| 4,709,255 | 11/1987 | Hartgring et al. | 357/23.5 |
| 4,733,482 | 3/1988 | West et al. | 357/23.5 |
| 4,745,086 | 5/1988 | Panillo et al. | 357/42 |

OTHER PUBLICATIONS

*IEEE Transactions on Electron Devices*, vol. ED-29, No. 4, Apr. 1982, "Fabrication of . . . Sidewall-Spacer Technology", pp. 590–596.

Primary Examiner—Jerome Jackson, Jr.
Attorney, Agent, or Firm—Bruce L. Adams; Van C. Wilks

[57] ABSTRACT

A semiconductor device uses a high melting point metal such as tungsten, molybdenum, etc. at its gate electrode and wirings for higher operation speed. In particular, the top and the side of the gate electrode and wirings are covered by a layer of silicon oxynitride whereby the gate electrode and the wiring are protected from oxidation and deterioration which may be cause by heat treatment in an oxidative atmosphere and ion implantation.

10 Claims, 1 Drawing Sheet

SEMICONDUCTOR DEVICE WITH SILICON OXYNITRIDE OVER REFRACTORY METAL GATE ELECTRODE IN LDD STRUCTURE

FIELD OF THE INVENTION

The present invention relates to a semiconductor device having a gate electrode and wirings composed of a high melting point metal and in particular to a semiconductor device of LDD structure having a metal gate covered by silicon oxynitride.

BACKGROUND OF THE INVENTION

In a conventional MIS semiconductor having a metal-insulator-silicon structure, the gate electrode and wirings are made of polycrystal silicon. In modern highly integrated circuits, however, polycrystal silicon poses a serious problem of propagation delay. To solve this problem, the gate electrode and wirings are made of a high melting point metal such as molybdenum (Mo) and tungsten (W) which has a lower resistance than polycrystal silicon. FIG.2(a) is a schematic cross sectional view of an MIS semiconductor device in which the gate electrode 13 composed of high melting point metal, and source and drain regions 15 are formed. The reference numeral 14 in FIG.2.(a) denotes damaged insulation ($SiO_2$) in a layer near the gate electrode 13. This damage is caused by the etching of the high melting point metal 13 or the ion implantation to form the source and the drain regions 15. In order to recover the damage in the insulation layer 14, the semiconductor device undergoes heat treatment in an oxidation atmosphere for re-oxidation. During the heat treatment, a film 17 of molybdenum oxide or tungsten oxide is formed as shown in FIG.2(b). It is unstable and fluctuates the characteristic properties of the completed element. In addition, it is sublimatable and consequently the heat treatment should be carried out under strictly controlled conditions. For this reason, the yield heretofore has been very low for semiconductor elements produced according to the process shown in FIG.2.

SUMMARY OF THE INVENTION

It is therefore an object of the present invention to provide a semiconductor device in which a high melting point metal is used for its gate electrode and wirings, and to provide a process for manufacturing the semiconductor device. The manufacturing process comprises steps of forming a gate insulating layer of silicon oxide on a silicon substrate; forming a layer of high melting point metal such as molybdenum and tungsten; forming a silicon oxynitride layer through the use of the CVD method etching the silicon oxynitride layer and the layer of high melting point metal selectively by photolithography, thereby forming a gate electrode and wirings of desired configuration; performing ion implantation to provide a lightly doped drain (LDD) structure, thereby forming a source and a drain having a high concentration; forming a silicon oxynitride layer again; and performing anisotropic etching over the entire surface of the wafer, thereby covering the top and sides of high melting metal gate and wirings with a silicon oxynitride layer. The semiconductor device produced according to the process of the present invention has stable characteristic properties. Being resistant to an oxidation atmosphere, the silicon oxynitride ($SiN_xO_y$) film protects the layer of high melting point metal from oxidation during the heat treatment, which is carried out to recover the damage in the insulation layer. Therefore, the layer of high melting point metal retains characteristic properties necessary for the gate electrode and wirings. In addition, the silicon oxynitride film also serves as an interlayer insulator between wirings because of its good insulating properties.

DETAILED DESCRIPTION OF THE PREFERRED EMBODIMENTS

Figure 1A:
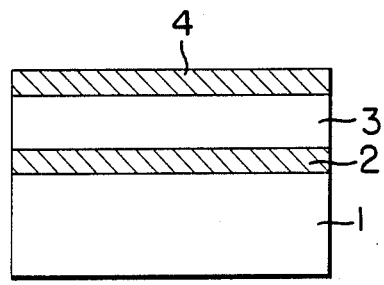
FIGS. 1(a) to 1(e) are cross sectional views showing the sequence of the steps used in the production of a semiconductor device according to the present invention.

The present invention is applied to the production of MIS semiconductor devices in which gate electrode and wirings are made of a high melting point metal such as Mo and W. The essential point of the present invention resides in producing a transistor having LDD (lightly doped drain) structure by the aid of a silicon oxynitride film formed so as to cover the top and sides of the high melting point metal. FIGS. 1(a) to 1(e) are sectional views showing the process used in a preferred embodiment of the invention. A MIS semiconductor is produced as follows: At first, on a silicon substrate 1 are successively formed a gate insulation layer 2, a layer 3 of high melting point metal such as Mo and W, and a silicon oxynitride layer 4, as shown in FIG. 1(a). The gate insulation layer 2 is usually composed of silicon oxide formed by the oxidation method. The silicon oxide film can also be formed by the CVD method, or any other insulation layer other than silicon oxide can be used. The layer 3 of high melting point metal such as Mo and W is formed by the physical vapor deposition (PVD) method such as sputtering, or by the chemical vapor deposition (CVD) method. The high melting point metal for the layer 3 should not necessarily be a pure single metal, it may be an alloy of Mo and Ta (tantulum), an alloy of W and Ti (titanium), and an alloy containing a considerable amount of Si (silicon). Silicon oxynitride constituting the layer 4 is represented by the chemical formula $SiN_xO_y$. The silicon oxynitride layer 4 is preferably formed by the CVD process. For example, it may be formed by chemically reacting three different gases, namely, dichlorosilane ($SiH_2Cl_2$), nitrous oxide ($N_2O$), and ammonia ($NH_3$) with one another at 700°-1000° C. in a CVD apparatus. It may also be formed formed by reacting gaseous silane ($SiH_4$), nitrous oxide ($N_2O$), and ammonia ($NH_3$) with one another at 600°-900° C. in a CVD apparatus. It may also be formed by reacting gaseous silane ($SiH_4$), nitrous oxide ($N_2O$), and ammonia ($NH_3$) with one another at 0 -600° C. in a plasma CVD or a photo CVD apparatus. It may also be formed by the PVD method, in which case sputtering is performed using silicon oxynitride itself as the target.

Figure 1D:
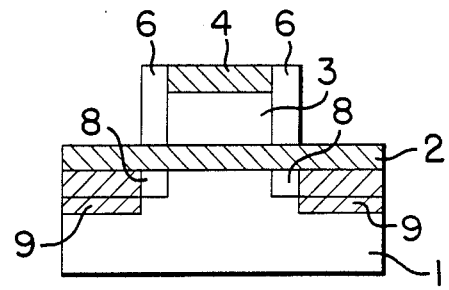
Figure 1B:
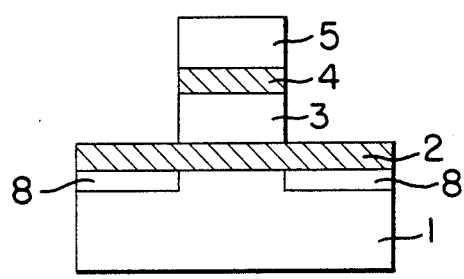

Subsequently, the silicon oxynitride layer 4 and the high melting point metal layer 3 are selectively removed by etching to form the gate electrode and wirings of desired configuration, by the aid of photolithography as shown in FIG. 1(b). The etching should be performed such that the silicon oxynitride layer 4 remaining unetched is not smaller than the gate electrode or wirings 3 remaining unetched. In other words, the etching should preferably be performed vertically by anisotropic etching which leaves the silicon oxynitride layer 4 and the gate electrode 3 the same size. After the etching is completed, the photoresist 5 is removed. The anisotropic etching for the gate electrode is important to control the dimension of the channel in the case of a small transistor having a short channel. After the etching, the first source and drain regions 8 are formed by a first ion implantation, using the gate electrode 3 and the silicon oxynitride layer 4 as the mask, as shown in FIG. 1(b). The dopant used in the first ion implantation is opposite to the one which determines the conductivity type of the silicon substrate or well. For example, it is an n-type element (phosphorus) if the silicon substrate is of p-type. The energy and amount of first ion implantation should be determined so that the resulting transistor has the most desirable characteristic properties. The amount of ion implantation is usually smaller than that in the second ion implantation (which will be mentioned later). In addition to the ion implantation, ion implantation for a p-type dopant or n-type dopant may be performed. It is also used as one kind of the LDD. In the case of a CMOS-type IC which needs the LDD structure for both n-type transistor and p-type transistor, the source and drain regions 8 having a low concentration may be produced by masking both of the transistors with a photoresist. In the case of a CMOS-type IC in which one transistor is of LDD structure and the other transistor is of ordinary source and drain structure, the former undergoes ion implantation of low concentration and the latter undergoes ion implantation of high concentration. Whether or not they are performed in this step or later depends on the process conditions. In other words, it should be taken into consideration that a large amount of dopant diffuses in the horizontal direction of the source and drain, if the ion implantation for a high concentration ( $1 \times 10^{15}/cm^2$ or above) is performed in the step shown in FIG. 1(b). In the ion implantation step shown in FIG. 1(b), the photoresist 5 functions as a mask for ion implantation, but it may be removed before ion implantation. Even if the photoresist 5 is removed, the silicon oxynitride layer 4 covering the top of the gate electrode 3 acts as a mask and prevents penetration of ions being implanted. It should be noted that a layer of high melting point metal such as Mo and W does not produce the masking effect for ion implantation on account of its columnar crystal structure.

Figure 1E:
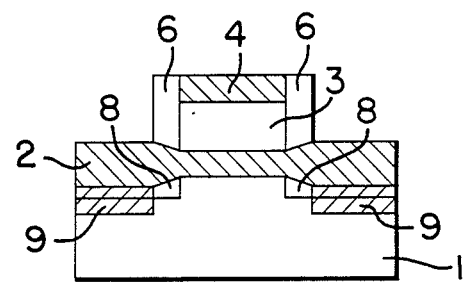
Figure 1C:
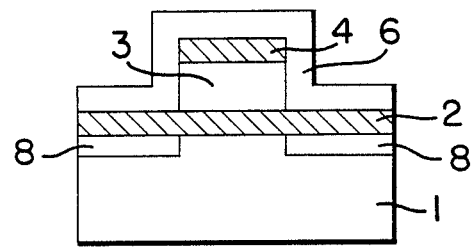
Figure 2A:
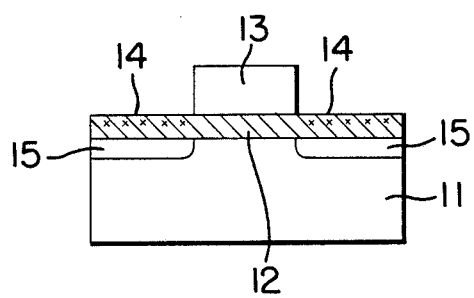
FIG. 2(a) and 2(b) are cross sectional views showing sections of a conventional semiconductor device during the production.
Figure 2B:
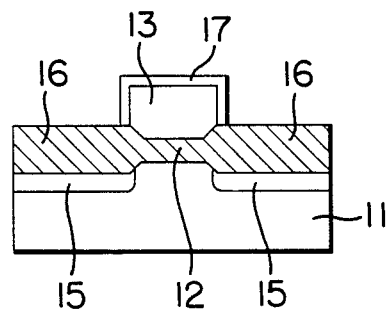

In the subsequent step, the second silicon oxynitride layer 6 is deposited as shown in FIG.1(c) in the same manner as used for the first silicon oxynitride layer. It is formed not only on the first silicon oxynitride layer 4 but also on the sides of the electrode gate 3. The entire surface of the wafer undergoes anisotropic etching to remove the second silicon oxynitride layer 6 except the one formed on the sides of the gate electrode and wirings 3, as shown in FIG. 1(d). This etching partly removes the first silicon oxynitride layer 4 but leaves it sufficiently for the subsequent steps if its initial thickness is adequate. In this way it is possible to produce the layer of high melting point metal such as Mo and W with the top and side thereof covered with a silicon oxynitride layer. A wafer undergoes the second ion implantation to form the source and drain regions 9 of high concentration. The dopant for the second ion implantation should be opposite to the one which determines the conductivity type of the substrate or well, and the amount of the dopant should be $1 \times 10^{15}/$ cm$^2$ or above. The second ion implantation is masked by the silicon oxynitride layers 4 and 6 covering the gate electrode 3 of high melting point metal. The end of the region or layer 9 formed by the second ion implantation shifts outward by the thickness of the second silicon oxynitride layer 6, from the end of the layer formed by the first ion implantation. Nevertheless, the layer 9 formed by the second ion implantation extends horizontally after the subsequent step because the concentration of the ion implanted is considerably high. Great care should therefore be taken to prevent it from extending beyond the layer formed by the first ion implantation; otherwise, it does not function as the LDD. A possible way to achieve this objective in the case of n-type transistor is to use arsenic (As), which has a low diffusion coefficient, for the second ion implantation. Another possible way is to slightly increase the thickness of the second silicon oxynitride layer 6 on the sides of the gate electrode. Still another possible way in the case of p-type transistor is to use BF for the second ion implantation. The second silicon oxynitride layer 6 should have a properly controlled thickness because it functions as the spacer of the LDD transistor. The thickness of the spacer is closely related with the subsequent heat treatment. Usually it should be 2000 to 6000 Å. This thickness is obtained more rapidly by the plasma CVD process than by any other processes. The layer of high melting point metal such as Mo and W does not work as a mask for ion implantation because of its columnar crystal structure; however, the silicon oxynitride layer 4 covering the top of the gate electrode and wirings blocks ion implantation.

Finally, the wafer undergoes heat treatment in an oxidation atmosphere to oxidize the insulation layer near the gate electrode as shown in FIG.1(e). This step is necessary to repair the damage on the insulation layer caused by etching carried out to form the gate electrode and wirings and by the ion implantation carried out to form the source and drain. In addition, the heat treatment may also be used, without any adverse effect on the gate electrode or wirings, to repair the damage which might be caused in the subsequent steps. Being stable, the silicon oxynitride layer protects the semiconductor element during heat treatment in a non-oxidation atmosphere such as nitrogen.

The present invention has been described above with reference to the silicon oxynitride covering the gate electrode (or conductor); however, it should be understood that the present invention can be applied to semiconductors in which metal film is used for wirings or the electrode and wirings are made of silicon alloy such as silicide or polysilicon.

Although the above explanation is concentrated on the silicon semiconductor, the present invention can also be applied to compound semiconductor (e.g.,GaAs) devices in which the gate electrode and wirings are composed of a high melting point metal.

The silicon oxynitride layer used in the present invention needs only to be thick and strong enough to withstand heat treatment so that it protects what is covered. Therefore, it does not necessarily need to be a single layer, but it may be combined with a layer of $SiO_2$ or $Si_3N_4$. The first silicon oxynitride layer 4 or the second silicon oxynitride layer 6 may be replaced by or combined with a silicon nitride ($Si_3N_4$) layer having a good oxidation resistance. The silicon nitride layer may also be produced by the CVD process. For example, it may be formed by reacting gaseous $SiH_2Cl_2$ and $NH_3$ with each other at 700 to 1000° C. in a CVD apparatus, or by reacting gaseous $SiH_4$ and $NH_3$ with each other at 600 to 900° C. in a CVD apparatus, or by reacting gaseous $SiH_4$ and $NH_3$ with each other at 0 to 600° C. in a plasma CVD apparatus or photo CVD apparatus. It may also be formed by the PVD process, in which case sputtering is performed using silicon nitride layer itself as the target. The silicon oxynitride layer covering the top and sides of the gate electrode and wiring of the LDD transistor formed as mentioned above has the following advantages: (1) It masks the gate electrode during ion implantation; (2) It protects the gate electrode and wirings from oxidation and deterioration by the heat treatment in an oxidation atmosphere; and (3) It protects the semiconductor from external contamination with mobile ions such as sodium (Na). These advantages lead to the improved reliability of the semiconductor device.

I claim:

1. A semiconductor device comprising: a silicon substrate; an insulation layer formed on said silicon substrate; a gate electrode composed of high melting point metal provided on said insulation layer; first source and drain regions provided in said substrate and spaced apart by a first channel region defined substantially by the width of said gate electrode; at least one layer of silicon oxynitride covering the top and each side of said gate electrode; and second source and drain regions provided in said substrate and spaced apart by a second channel region defined substantially by the combined widths of said gate electrode and said silicon oxynitride layer.

2. A semiconductor device as defined in claim 1, wherein said gate electrode includes a wiring connected thereto with at least one layer of silicon oxynitride covering the top and each side thereof.

3. A semiconductor device as defined in claim 1, wherein said silicon oxynitride layer is a chemical vapor deposited layer.

4. A semiconductor device as defined in claim 2, wherein said silicon oxynitride layer is a chemical vapor deposited layer.

5. The semiconductor device of claim 1, in which said gate electrode is formed of molybdenum.

6. The semiconductor device of claim 1, in which said gate electrode is formed of tungsten.

7. The semiconductor device of claim 1, in which said first channel region is separated from said gate electrode by said insulation layer.

8. The semiconductor device of claim 1, in which said first source and drain regions are more weakly doped than said second source and drain regions.

9. The semiconductor device of claim 1, in which said first channel region is no wider than said gate electrode.

10. The semiconductor device of claim 1, in which said second channel region is no wider than the combined widths of said gate electrode and said silicon oxynitride layer covering the sides thereof.

* * * * *